Aug. 25, 1959 A. E. DEVENDORF 2,901,615

AUTOMATIC TUNING SYSTEM

Filed April 25, 1958 2 Sheets-Sheet 1

INVENTOR:
ALAN E. DEVENDORF,
BY Joseph Levinson
HIS ATTORNEY.

Aug. 25, 1959 A. E. DEVENDORF 2,901,615

AUTOMATIC TUNING SYSTEM

Filed April 25, 1958 2 Sheets-Sheet 2

INVENTOR:
ALAN E. DEVENDORF,
BY Joseph Levinson
HIS ATTORNEY

United States Patent Office 2,901,615
Patented Aug. 25, 1959

2,901,615

AUTOMATIC TUNING SYSTEM

Alan E. Devendorf, Fulton, N.Y., assignor to General Electric Company, a corporation of New York Application April 25, 1958, Serial No. 730,896

11 Claims. (Cl. 250—40)

Figures 1, 6, 7, 8:
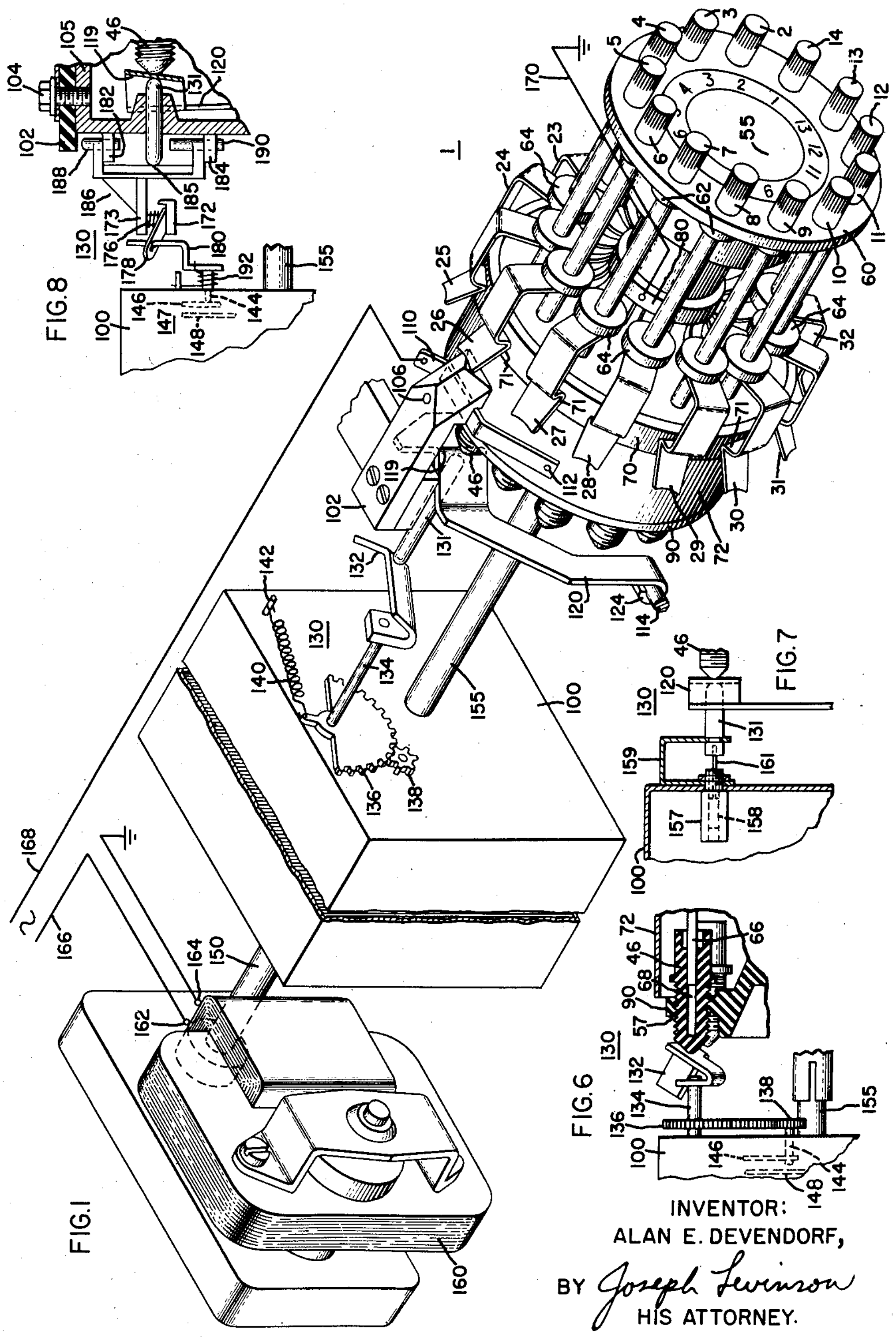

This invention relates to a tuning system for a television receiver, and more particularly to a tuning system which provides automatic fine tuning in conjunction with automatic channel selection for a television receiver.

A "tuner" in a television receiver is an electronic device having an oscillator including a plurality of resonant circuits each of which may be tuned to a particular frequency range which represents a given television channel. A switching device commonly referred to as a "channel selector" is generally provided which functions to connect a predetermined resonant circuit in the oscillator circuit to permit the operator to select the desired frequency range or channel. Conventional tuning systems also include a vernier or fine tuning means for varying the frequency within any given frequency range or channel thereby providing "fine tuning." "Fine tuning" may be accomplished by connecting a variable impedance element in the oscillator circuit of the tuner. When the variable impedance element is adjusted over a predetermined range, the frequency of the oscillator is varied in accordance with the adjustment over a predetermined range corresponding to the frequency range of the channel selected.

In many conventional tuning systems both the channel selector and the fine tuning means are manually adjusted each time a different channel is desired. It would be convenient to provide automatic channel selection without the necessity of manually rotating a channel selector knob. Furthermore, it would also be desirable to have the viewer manually adjust the fine tuning for each channel in such a manner that subsequent channel selection would automatically provide for fine tuning without requiring a further fine tuning adjustment.

Accordingly, it is an object of this invention to provide a novel automatic tuning system for a television receiver which automatically provides for channel selection.

It is a further object of this invention to provide a novel automatic tuning system for a television receiver which provides automatic fine tuning.

Still a further object of this invention is to provide a novel power tuning system for a television receiver which automatically provides for channel selection and fine tuning simultaneously.

A still further object of this invention is to provide a novel power tuning system which is mechanically simple, reliable and less expensive than other automatic tuning systems which perform the same or similar functions.

Still a further object of this invention is to provide a novel automatic tuning system which is easy to assemble.

In carrying out this invention, a channel selector knob is provided having a plurality of push buttons thereon representing a plurality of television channels. The channel selector knob is adapted to be rotated by a motor driven control shaft. The control shaft is intercoupled with the tuner shaft of a television tuner. Rotation of the tuner shaft switches the proper circuits in the television tuner to select the desired television channel. By depressing the push button corresponding to the desired channel, the motor circuit is closed thereby rotating the shafts a predetermined amount to select the proper channel. Means are provided for opening the motor circuit to thereby stop the shaft rotation when the desired channel is reached. Consequently, channel selection is automatically accomplished by depressing the push button of the desired television channel. A variable impedance element is provided in the television tuner for fine tuning purposes. An adjustable fine tuning screw is provided for each channel which is adapted to be adjusted by a corresponding push button. The setting of the fine tuning screw is transmitted by a fine tuning linkage means to the variable impedance element for the adjustment thereof in accordance with the setting of the fine tuning screw. Once the fine tuning adjustment is initially made, it is set so that subsequent selection of the same channel automatically provides fine tuning for that channel.

These and other advantages of this invention will be more clearly understood from the following description taken in connection with the accompanying drawings, and its scope will be apparent from the appended claims.

Figure 2:
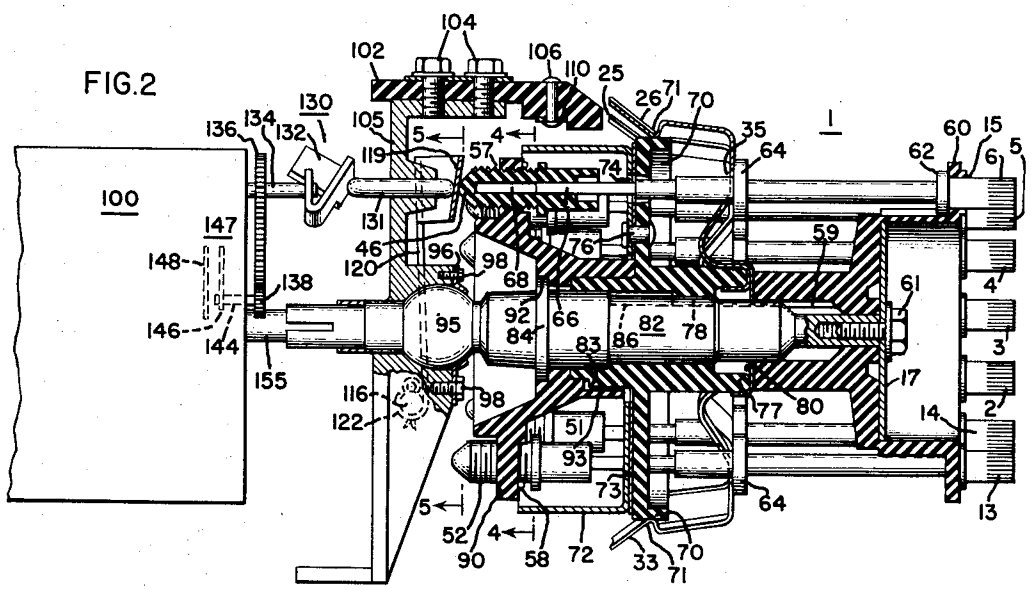
Figures 3, 4, 5:
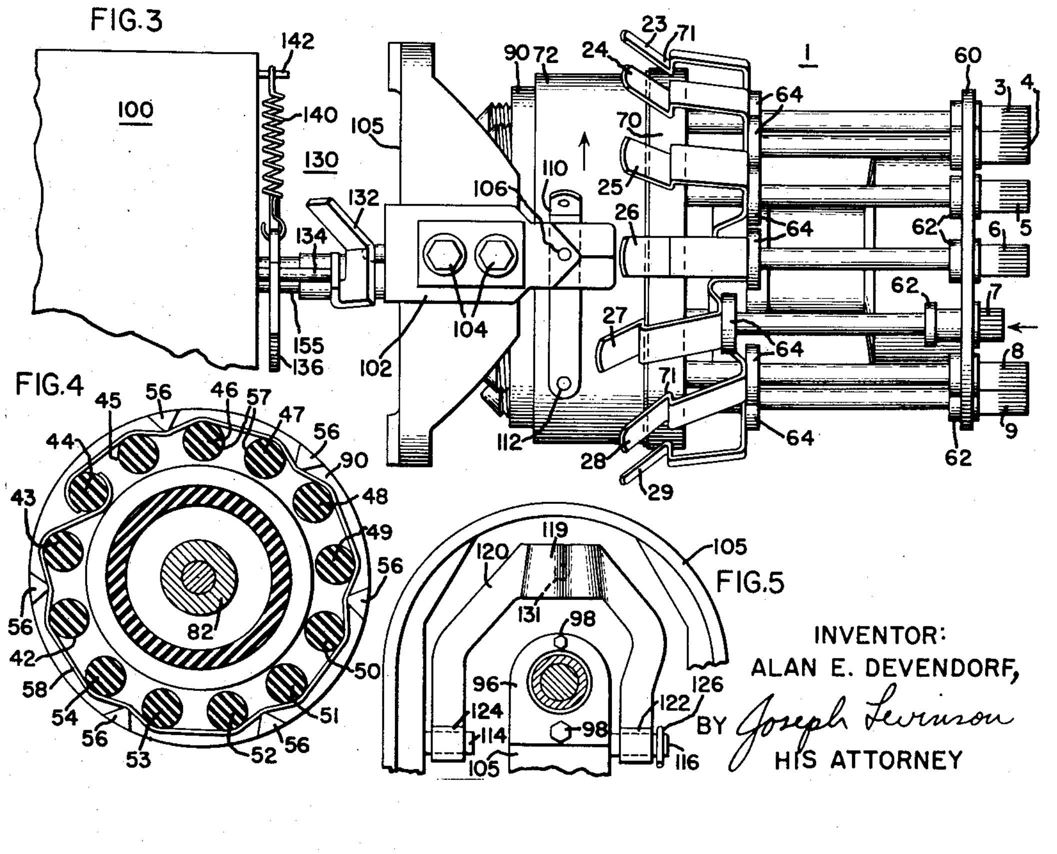

In the drawings,

Fig. 1 is a perspective view of the automatic tuning system embodied in this invention, Fig. 2 is a partial side elevation, partly in section, of the automatic tuning system shown in Fig. 1, Fig. 3 is a top view of the automatic tuning system shown in Fig. 2, Fig. 4 is a cross-sectional view taken along lines 4—4 of Fig. 2, Fig. 5 is a cross-sectional view taken along lines 5—5 of Fig. 2, Fig. 6 shows an alternative embodiment of a fine tuning linkage means which may be employed in the automatic tuning system of Fig. 1, Fig. 7 shows another embodiment of a fine tuning linkage means, and Fig. 8 shows a preferred embodiment of a fine tuning linkage means which may be employed in the automatic tuning system shown in Fig. 1.

The automatic tuning system of this invention provides a unitary device for providing automatic channel selection and fine tuning simultaneously. Although a unitary structure is provided for performing both functions, the automatic channel selection and the fine tuning adjustment for a given channel are treated separately for purposes of disclosure.

Referring now to Figs. 1–3, the automatic tuning system embodied in this invention generally comprises a channel selector means 1, a fine tuning linkage means 130, a tuner 100, and a motor 160. Before a specific description is given with reference to the above basic components of this system, it should be pointed out that the tuner 100 which has a tuner shaft 155 is of conventional form well known to those skilled in the art. It is assumed that the necessary electrical circuits and means for properly switching these circuits including the tuner shaft 155 are provided in the tuner such that when the channel selector means is set to select a particular television channel that the tuner has circuitry capable of providing the desired frequency range of the channel selected. Also with respect to the fine tuning function performed in the present system, all that is necessary for purposes of this disclosure is that the tuner have a variable impedance element which when varied acts as a fine tuning means within the tuner. Such means are also generally provided in conventional tuners presently utilized in the art.

The channel selection means 1 is provided with a channel selector knob 60 having a plurality of push buttons 2–14 positioned through openings 15 therein. Each push button has an annular flange 62 thereon for positioning the respective push buttons in their respective openings in the channel selector knob 60. The channel selector knob 60 is positioned on a control shaft 82 by means of a key 59 thereon which registers with a keyway 86 in the control shaft 82 and is secured thereto by means of a screw 61. This type of mounting allows the channel selector knob to rotate with the control shaft 82.

A bearing disc 70 of suitable insulating material is mounted on the shaft 82 by means of a key 78 thereon which registers with the keyway 86 in the control shaft 82. A plurality of spring contacts 22–34 each having an opening 35 therein are mounted upon an annular flange 77 and the bearing disc 70. The spring contacts or clips are conductively connected to the shaft 82 by a grounding disc 80. It will be noted that a cooperating spring contact is providing for each push button. Each push button is also provided with an annular flange 64 thereon for registration with a cooperating spring clip such that when any given push button is depressed the annular flange 64 of that push button bears upon the spring contact thereby pushing it forward. Each spring contact is provided with a latching finger 71 which normally rests on the periphery of the bearing disc 70. The latching fingers 71 are so formed that a tension is provided in the spring contacts when the fingers thereof rest on the bearing disc 70. A collector ring 72 is mounted on the bearing disc 70 but separated therefrom by a filler disc 73 by means of rivets 76. The collector ring 72, the filler disc 73 and the bearing disc 70 have a plurality of openings 74 therethrough to accommodate the passage of the push buttons 2–14 therethrough. The fingers 71 of the spring contacts are adapted to latch into engagement with the collector ring 72 when pushed forward by a push button with the knee of the fingers bearing on the filler disc 73 and collector ring 72.

The control shaft 82 is rotatably mounted in a mounting plate 105 by the bearings 95 which are rotatably secured to the mounting plate 105 by a shaft bearing plate 96 fastened to the plate 105 by a pair of screws 98. The bearings 95 consists of a pair of molded pieces having a generally round configuration forming an annulus around the shaft 82 which allows the shaft 82 to freely rotate in the mounting plate 105. The generally spherical shape of the bearings 95 allows for universal movement to aid in aligning the shaft 82 with another shaft to which it is adapted to be connected. A contact shoe 102 is secured to the mounting plate 105 by a pair of screws 104. A terminal 110 is secured to the contact shoe by a rivet 106. The terminal 110 has a contact member 112 which makes contact with the collector ring 72.

The channel selector means 1 is adapted to be driven by a motor 160 having a drive shaft 150 thereof coupled to the tuner shaft 155 which in turn is coupled to the control shaft 82 of the channel selector means 1. The shafts 155 and 82 are preferably intercoupled in a manner shown and described in an application to John M. Parsons, Serial No. 721,821 which is assigned to the assignee of the present application. The shafts 150 and 155 may be intercoupled in any suitable manner. The motor 160 is adapted to be energized from a suitable source of potential applied via a pair of lines 166 and 168. The line 166 is connected from the source of potential to a terminal 162 of a field winding of the motor 160. A terminal 164, which is the other field winding of the motor 160, is connected to ground. The line 168 is connected to terminal 110 which is connected to the collector ring 72 by the contact 112 thereon. Consequently, when any of the contact fingers 71 of the spring contacts 22–34 become latched to collector ring 72 by depressing a push button, the motor circuit is completed as line 168 is effectively grounded as shown in Fig. 1 through a line 170 to ground. In practice, a ground line 170 is not required as the ground connection is provided from the grounding disc 80 to the control shaft which is coupled to the tuner shaft 155 which in turn is grounded to the chassis through the tuner 100.

In operation, channel selection is obtained by depressing a push button which in turn closes the motor circuit by grounding line 168, thereby applying operating potential to the field winding of motor 160. Fig. 3 shows the push button 7 depressed, indicating that the operator desires to select channel 7. Depressing push button 7 causes the contact finger 71 of spring contact 27, which normally rests upon the insulated bearing disc 70, to be forced into engagement and latched to the collector ring 72 due to the pressure exerted upon the spring contact 27 by the annular flange 64 of push button 7. When the spring finger 71 of the contact spring 27 engages the collector ring 72, one side of the source of operating potential for the motor 160 is grounded via line 168, terminal 110, collector ring 72, contact spring 27, and grounding disc 73 through line 170 to ground. This supplies an operating potential across the motor field at terminals 162 and 164 of motor 160 thereby energizing the motor causing drive shaft 150 to rotate. Rotation of the drive shaft 150 causes the tuner shaft 155 and control shaft 82 to rotate therewith. The control shaft 82 turns the collector ring 72, the bearing disc 70, and the channel selector knob 60 which are all rotatably coupled thereto. The entire channel selector means 1 is rotated until contact finger 71 of spring contact 27 engages the contact shoe 102. At this point, contact spring 27 is released from its latched engagement with the collector ring 72 by contact shoe 102 thereby releasing the push button 7 which assumes its normally non-depressed position with its associated spring contact 27 again riding upon the insulated bearing disc 70. This operation breaks the motor energizing circuit and stops the rotation of the channel selector means 1. Meanwhile, the rotation of the tuner shaft 155 has provided the necessary switching in the tuner 100 to properly select channel 7. The channel selected is properly locked in by a detent mechanism commonly employed in tuners which is not shown but is considered to be conventional. The detent mechanism would prevent the channel selector from overshooting the desired channel.

It should be pointed out that the channel selector knob may be manually rotated if the operator does not wish to utilize the power tuning feature. The channel selector knob 60, the bearing disc 70, and the push buttons 2–14 are all preferably made of suitable insulating material, such as plastic, to allow them to be molded into the desired shapes. By making these elements of insulating material, the operator is thereby protected from the electrical circuits in the receiver.

In order to obtain fine tuning, a plurality of fine tuning screws 42–54 which are mounted in a plurality of threaded holes 57 in a fine tuning disc 90 are provided which are adapted to be adjusted by rotation of the push buttons 2–14, respectively. The setting of the fine tuning screws is transmitted by a fine tuning linkage means, referred to generally with the reference character 130, to a variable impedance element 147 in the tuner 100 to adjust the frequency of a given channel within a certain range to provide the requisite fine tuning. Each fine tuning screw is provided with a channel 68 therein adapted to receive a respective push button tongue portion 66. The tongue portion 66 of each push button is adapted to be slidably mounted within the channel 68 of a corresponding fine tuning screw. A small amount of play is provided so that the mere slight turning which might occur in depressing a push button does not turn the screw and change its setting. The intercoupling is designed such that the screw is rotated by the rotation of its respective push button. The fine tuning mounting disc 90 is provided with a keyway 93 which registers with a key 83 on the bearing disc 70. Therefore, the fine tuning disc 90 is mounted on the bearing disc 70 with the keyway 93 of the fine tuning disc 90 registering with the key 83 of the bearing disc 70. The fine tuning disc 90 also has an annular shelf 92 thereon which registers with an annular flange 84 on the control shaft 82 to provide further positioning and mounting of the fine tuning disc 90 on the control shaft 82. From Fig. 4, it will be seen that a fine tuning screw is provided for each channel push button. A spring wire 58 which is positioned by a series of spaced triangular posts 56 tensions the fine tuning screws to hold them in their set positions. This prevents a change in setting of the screws which might occur due to vibration, shock, or other movement.

The fine tuning linkage means 130 which performs the function of transmitting the setting of a fine tuning screw into a finite impedance determined from such setting is best shown in Figs. 1, 2 and 5. The fine tuning linkage means 130 includes a fine tuning guide 120 which generally takes the form of a horseshoe shape, the legs of which terminate in a pair of eyelets 122 and 124. The mounting plate 105 is provided with a pair of pins 114 and 116 which are adapted to receive the eyelets 124 and 122, respectively, of the fine tuning guide 120 (see Fig. 5). A cotter pin 126 mounted on the pin 122 holds the fine tuning guide 120 in position on the mounting plate 105. As will be seen in Fig. 2 the fine tuning screw 46 bears on one side of a generally V-shaped base or intermediate portion 119 of the fine tuning guide 120. A guide pin 131 which is positioned in an opening in the mounting plate 105 is adapted to bear on the other side of the intermediate portion 119 of the guide 120. The fine tuning guide 120 and pin 131 may be considered to be "floating" or movable in accordance with the settings of the fine tuning screws. The other end portion of guide pin 131 bears on a rocker arm 132. The rocker arm 132 is mounted on a shaft 134 which drives a gear 136. Tension is provided on the gear 136 to prevent undesired movement thereof by a spring 140 which is coupled to the gear and to a mounting post 142. The gear 136 drives a pinion 138 which drives its associated shaft 144. Attached to the shaft 144 is a movable plate 146 of the variable impedance element 147. The variable impedance element in this showing is an air capacitor having a fixed plate 148 and a movable plate 146. As will appear obvious to those skilled in the art, other types or forms of variable impedance elements may be employed.

As will be seen on Fig. 2, the generally V-shaped intermediate portion 119 of fine tuning guide 120 bears on the fine tuning screw 46 which is associatively connected to the push button 6. The fine tuning guide 120 is resilient and moves to a different setting for each channel provided that the fine tuning screw for that channel is set in a different position from the preceding fine tuning screw. The rocker arm 132 is generally V-shaped and bears on the fine tuning pin 131 such that pin 131 follows the fine tuning guide 120 for each setting. Once the fine tuning guide 120 bears on a given fine tuning screw, a counter force is applied by the fine tuning pin 131 on the rocker arm 132 to rotate the gear 136. The position of fine tuning pin 131, of course, corresponds to the setting of the fine tuning screw which bears on the fine tuning guide 120 at any given time. Consequently, the position of the fine tuning guide 120 may be varied by any given setting of any of the fine tuning screws, and this setting is transmitted by the fine tuning pin 131 to the rocker arm 132, and finally through the gear and pinion mechanism to the movable plate of the variable impedance element 147 in the tuner 100.

In providing a fine tuning adjustment in the automatic tuning system embodied in this invention, it is necessary for the fine tuning screw of the channel to which the fine tuning adjustment is to be made in contact with the fine tuning guide 120. In Fig. 2 fine tuning screw 46 is in such a position. It is possible to adjust any of the fine tuning screw settings which are not in contact with the fine tuning guide 120. However, no visible means for setting the adjustment are available for the operator in order to determine whether the adjustment is properly made or not. A vernier or fine tuning adjustment may be provided for channel 6 by merely rotating the push button 6. This turns the fine tuning screw 46 which bears upon the fine tuning guide 120 and pin 131. The pressure exerted by the fine tuning screw 46 on the fine tuning guide 120 and guide pin 131 is converted into radial movement by the rocker arm 132 which ultimately acts to adjust the variable plate 146 of the variable impedance element 147 to provide a fine adjustment in frequency in the tuner 100, and thereby provide fine tuning for channel 6. Fine tuning may likewise be provided for any given channel by merely rotating the channel selector knob to the channel desired and by rotating the push button associated therewith. Once the vernier or fine tuning adjustment has been made for any given channel, further adjustment in switching back to that channel will not ordinarily be necessary. Consequently, automatic fine tuning is provided in that once an initial setting has been made, no further fine tuning adjustment is ordinarily required.

It should be pointed out that the function performed by the fine tuning linkage means 130 is merely to translate the setting of a fine tuning screw into a corresponding setting of the variable impedance element 147 in the tuner 100 to provide the necessary fine tuning adjustment. Consequently, the fine tuning linkage means 130 may take any number of different forms. For example, Fig. 6 shows an alternative form of fine tuning linkage means 130 in which the fine tuning screws bears directly on the rocker arm 132. In this embodiment, the setting of fine tuning screw is translated to the variable impedance element 147 the same as in the preceding embodiment except that the guide pin 131 and fine tuning guide 120 have been eliminated. These elements were employed so that conventional tuners could be used for either manual tuning systems or power tuning systems without requiring alteration in the tuners to adapt them to the type of tuning system employed.

In Fig. 7, a different form of fine tuning linkage 130 is shown. In this embodiment the variable impedance element is a variable inductance having stationary coil 157 and a tunable core 158 slidably mounted therein. The tunable core 158 is coupled to the guide pin 131 by a link 161. A spring clip 159 resiliently supports the guide pin 131. The setting of a fine tuning screw is transmitted to the movable core 158 by the guide pin 131 and link 161 in the form of a plunger-type action. By varying the position of the tunable core 158, the inductance of the variable impedance element is changed corresponding to the settings of the fine tuning screws transmitted thereto. Accordingly, the frequency of the tuner may be varied to provide for fine tuning.

Fig. 8 shows another embodiment of the fine tuning linkage means 130 which may be utilized with the automatic tuning system of this invention. The embodiment shown in Fig. 8 is the preferred form of fine tuning linkage means and is the subject matter of a co-pending application, Serial No. 730,895 which is assigned to the assignee of the present invention. Consequently, only a brief treatment of this form is given. The function of the fine tuning linkage means 130 is the same as in the embodiment of Figs. 1–3, and that is to transmit the horizontal movement of the fine tuning guide 120 and pin 131 into radial movement in accordance with the setting of a particular fine tuning screw. A swivel plate 186 having a bearing surface 185 is provided with a pair of pins 188 and 190 which are adapted to be received in openings in a pair of flanges 182 and 184, respectively, which are a unitary part of the mounting plate 105. The swivel plate 186 is provided with a leg 173 having a shoe 172 thereon. A spring 176 is mounted on the leg 173 as is a link 178 which is spring loaded by the action of spring 176. The link 178 is coupled to a capacitor arm 180 which is adapted to drive a shaft 144 connected to the movable plate 146 of the variable impedance element 147. The capacitor arm 180 is also spring loaded by a spring 192 mounted on the shaft 144.

In operation, the guide pin 131 bears on the bearing surface 185 of the swivel plate 186 in accordance with the positioning or setting of the fine tuning screw of the channel desired to be fine tuned. The swivel plate 186 rocks in accordance with the pressure exerted thereon by the pin 131 which motion is transmitted to the link 178 and in turn to the capacitor arm 180. The capacitor arm 180 rotates the shaft 144 in accordance with the setting of the fine tuning screw for that particular channel thereby rotating the variable element of the impedance in the tuner which provides fine tuning.

Briefly, to provide for automatic channel selection a push button of the desired channel is depressed which energizes the motor 160 thereby rotating the drive shaft 150, the tuner shaft 155 and the control shaft 82. Rotation of the tuner shaft performs the function of switching to the desired circuits in the tuner 100 while the control shaft functions to rotate the entire channel selection means 1. When the desired channel is reached, the motor circuit is broken thereby stopping rotation of the tuner and control shafts. Fine tuning may then be accomplished by rotating the push button of the selected channel to vary the setting of its fine tuning screw which thereby varies the setting of a variable impedance element in the tuner 100. Once this initial setting is made, the same channel may again subsequently be selected without requiring additional fine tuning. In the latter instance, the operator need merely press the push button of the desired channel to obtain automatic channel selection and fine tuning simultaneously.

The automatic tuning system embodied in this invention provides the combined advantages of mechanical simplicity, easy assemblage, and reliability. In assembling the device, the control shaft 82 and the fine tuning guide 120 are first mounted on the mounting plate 105. The spring contacts 22–34 are placed in a jig and mounted on the bearing disc 70. The collector ring is riveted to the bearing disc by rivets 76 in the same operation. Then the fine tuning disc 90 with the fine tuning screws 42–54 mounted therein are mounted on the bearing disc 70. This assembly is then mounted on the control shaft 72 by means of the key 78 in cooperation with the keyway 86 in the control shaft 82, and the grounding disc 80 is slipped on the shaft 82. Push buttons 2–14 are then inserted through their respective spring contacts 22–34 and into their respective fine tuning screws 42–54. The channel selector knob is positioned thereon and secured to the control shaft 82 by means of the screw 61. Thus, the device lends itself to ready assemblage which is consonant with the mass production techniques now employed in manufacturing television receivers.

As shown in Fig. 1, a luminous screen 55 may be mounted on the channel selector knob and a stencil ring 17 (see Fig. 2) may be mounted on the control shaft 82 by the screw 61. The stencil ring 17 is provided with numbers indicative of the channel selected. A light (not shown) may be provided to project through the stencil ring for indicating on the luminous screen 55 the number of the channel selected.

It will be noted that thirteen push buttons are provided. The extra push button may be utilized for switching to UHF as indicated on Fig. 1. Fine tuning is not provided for UHF channels by this unit. Accordingly, the fine tuning screw 54 may be a dummy screw.

It should be pointed out that one of the advantages of this invention resides in the relative simplicity of the parts employed in the unit. No special machining is required and many of the parts such as the channel selector knob 60, the push buttons 2–14, the bearing disc 70, the fine tuning disc 90, and the fine tuning screws 42–54 may all be molded from suitable materials such as plastic. As was stated previously, molding the parts is not only less expensive, but also provides insulation between the operator and the internal electrical circuits of the receiver.

Since other modifications varied to fit particular operating requirements and environments will be apparent to those skilled in the art, the invention is not considered limited to the examples chosen for purposes of disclosure and covers all changes and modifications which do not constitute departures from the true spirit and scope of this invention.

What I claim as new and desire to secure by Letters Patent of the United States is:

1. In a power tuning system for automatically selecting a television channel comprising in combination, a motor, a motor circuit connected to said motor for supplying operating potential thereto when said motor circuit is closed, a control shaft adapted to be rotatably driven by said motor when said motor circuit is closed, a channel selector knob coupled to said control shaft and rotatable therewith, a plurality of push buttons on said channel selector knob each corresponding to a different channel, a plurality of spring contacts conductively mounted on said control shaft, each of said spring contacts coupled to a different push button, a collector ring adapted to be contacted by any one of said spring contacts when the push button to which it is coupled is depressed, a terminal in said motor circuit conductively contacting said collector ring whereby said motor circuit is closed when a push button is depressed.

2. The structure set forth in claim 1 wherein a contact shoe is operatively associated with said collector ring for releasing a spring contact in contact with said collector ring when said spring contact encounters said contact shoe thereby opening said motor circuit.

3. A tuning system for providing channel selection and fine tuning for a tuner of a television receiver, comprising in combination, a control shaft, a channel selector knob mounted on said control shaft for rotation therewith, a plurality of push buttons on said control knob each representing a different television channel, a tuner, a variable impedance element mounted in said tuner for providing fine tuning therefor, fine tuning linkage means coupled to said variable impedance element for adjusting the impedance thereof, adjustable means coupled to each of said push buttons for adjustment thereby, said adjustable means being selectively engageable with said fine tuning linkage means to thereby vary the impedance of said impedance element in said tuner in accordance with the setting of said adjustable means.

4. In a tuning system comprising in combination, a rotatable shaft, a channel selector knob having a plurality of push buttons thereon mounted on said shaft for rotation therewith, a fine tuning disc having a plurality of fine tuning screws rotatably mounted therein, each fine tuning screw having an opening therein adapted to slidably receive an end portion of a push button for rotation whereby each of said screws are adjustable by a cooperating push button, a variable impedance, fine tuning linkage means coupled to said variable impedance for varying the impedance thereof, and means for selectively coupling the fine tuning screws to said fine tuning linkage means whereby the impedance of said variable impedance is adjusted in accordance with the setting of the screw coupled to said fine tuning linkage means.

5. A tuning system for providing channel selection and fine tuning for a tuner of a television receiver, comprising in combination, a control shaft, a channel selector knob mounted on said control shaft for rotation therewith, a plurality of push buttons on said control knob each representing a different television channel, a tuner, a variable impedance element mounted in said tuner for providing fine tuning therefor, fine tuning linkage means coupled to said variable impedance element for adjusting the impedance thereof, a fine tuning screw coupled to each of said push buttons for adjustment thereby, said fine tuning screws being selectively engageable with said fine tuning linkage means to thereby vary the impedance of said impedance element in said tuner in accordance with the setting of any one of said fine tuning screws.

6. An automatic tuning system for providing automatic channel selection and fine tuning for a television receiver comprising in combination, a tuner having a tuner shaft, a variable impedance element connected in circuit in said tuner for providing fine tuning therefor, a control shaft coupled to said tuner shaft for rotation therewith, a channel selector knob mounted on said control shaft for rotation therewith, a plurality of push buttons on said channel selector knob each corresponding to a different channel, a motor coupled to said tuner shaft for rotatably driving said tuner and control shafts, an energizing circuit connected to said motor for supplying operating potential thereto when said energizing circuit is closed, means coupled to said push buttons for closing said energizing circuit when one of said push buttons is depressed thereby energizing said motor to rotate said shafts, means for opening said energizing circuit thereby stopping the rotation of said shafts when the channel corresponding to the push button depressed is reached, adjustable fine tuning means coupled to each of said push buttons for adjustment thereby, a fine tuning linkage means coupled to said variable impedance element, said adjustable fine tuning means being selectively engageable with said fine tuning linkage means whereby the adjustment of said adjustable fine tuning means is transmitted by said fine tuning linkage means to said variable impedance element to vary the impedance thereof.

7. The structure set forth in claim 6 wherein said adjustable fine tuning means consists of a fine tuning screw for each push button.

8. In an automatic tuning system for providing automatic channel selection and fine tuning for a television receiver comprising in combination, a control shaft, a channel selector knob having a plurality of push buttons thereof each corresponding to a different television channel mounted on said control shaft for rotation therewith, a bearing disc mounted on said control shaft for rotation therewith, a spring contact for each of said push buttons mounted on said bearing disc, each of said spring contacts having an opening therein which is adapted to receive a push button and to be depressed thereby, a grounding disc mounted on said shaft and said spring contacts for conductively connecting said spring contacts to said shaft, a collector ring mounted on said bearing disc which is adapted to be contacted by said spring contacts when said spring contacts are depressed by an associated push button, a fine tuning disc mounted on said bearing disc and said control shaft, said fine tuning disc having a fine tuning screw for each of said push buttons mounted therein, each of said fine tuning screws having a channel therein adapted to slidably receive an end portion of a push button therein, said fine tuning screws being rotatable by an associated push button.

9. An automatic tuning system for providing automatic channel selection and fine tuning for a television receiver comprising in combination, a tuner having a tuner shaft, a variable impedance element connected in circuit in said tuner for providing fine tuning therefor, a control shaft coupled to said tuner shaft for rotation therewith, a channel selector knob mounted on said control shaft for rotation therewith, a plurality of push buttons on said channel selector knob each corresponding to a different channel, a motor coupled to said tuner shaft for rotatably driving said tuner and control shafts, an energizing circuit connected to said motor for supplying operating potential thereto when said energizing circuit is closed, a collector ring connected in said energizing circuit, a spring contact for each of said push buttons connected to ground and adapted to make contact with said collector ring when the push button associated therewith is depressed thereby closing said energizing circuit, means associated with said contact springs for opening the energizing circuit by breaking contact between the spring contacts and the collector ring when the desired channel is reached, adjustable fine tuning means coupled to each of said push buttons for adjustment thereby, a fine tuning linkage means coupled to said variable impedance element, said adjustable fine tuning means being selectively engageable with said fine tuning linkage means whereby the adjustment of said adjustable fine tuning means is transmitted by said fine tuning linkage means to said variable impedance element to vary the impedance thereof.

10. In an automatic tuning system for providing automatic channel selection and fine tuning for a television receiver comprising in combination, a control shaft, a channel selector knob having a plurality of push buttons thereof each corresponding to a different television channel mounted on said control shaft for rotation therewith, a bearing disc mounted on said control shaft for rotation therewith, a spring contact having a contact finger for each of said push buttons mounted on said bearing disc with said contact finger normally bearing on the periphery of said bearing disc, each of said spring contacts having an opening therein which is adapted to receive a push button and to be depressed thereby, a grounding disc mounted on said shaft and said spring contacts for conductively connecting said spring contacts to said shaft, a collector ring mounted on said bearing disc, said contact fingers of said spring contacts being adapted to be latched in engagement with said collector ring when said spring contacts are depressed by an associated push button, a fine tuning disc mounted on said bearing disc and said control shaft, said fine tuning disc having a fine tuning screw for each of said push buttons mounted therein, each of said fine tuning screws having a channel therein adapted to slidably receive an end portion of a push button therein, said fine tuning screws being rotatable by an associated push button.

11. The structure set forth in claim 10 including a contact shoe operatively associated with said collector ring for disengaging said contact fingers from said collector ring.

References Cited in the file of this patent

UNITED STATES PATENTS

| | | |
|---|---|---|
| 2,465,956 | Yardeny | Mar. 29, 1949 |
| 2,646,513 | Marco | July 21, 1953 |